(12) United States Patent
Glaskowsky et al.

(10) Patent No.: US 9,954,557 B2
(45) Date of Patent: Apr. 24, 2018

(54) VARIABLE WIDTH ERROR CORRECTION

(71) Applicant: Microsoft Corporation, Redmond, WA (US)

(72) Inventors: Peter Glaskowsky, Carnation, WA (US); Karin Strauss, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 98 days.

(21) Appl. No.: 14/265,907

(22) Filed: Apr. 30, 2014

(65) Prior Publication Data

US 2015/0318870 A1 Nov. 5, 2015

(51) Int. Cl.
*H03M 13/35* (2006.01)
*G06F 11/10* (2006.01)
*H03M 13/51* (2006.01)

(52) U.S. Cl.
CPC ......... *H03M 13/35* (2013.01); *G06F 11/1048* (2013.01); *G06F 11/1076* (2013.01)

(58) Field of Classification Search
CPC ... H03M 13/35; H03M 13/09; G06F 11/1076; G06F 11/10; G06F 11/1008; G06F 11/1068; G06F 11/1072; G06F 11/1048; G11C 29/56; G11C 29/48; H04L 1/0057
See application file for complete search history.

(56) References Cited

U.S. PATENT DOCUMENTS

| | | |
|---|---|---|
| 3,800,286 A | 3/1974 | Brown et al. |
| 4,241,401 A | 12/1980 | De Ward et al. |
| 5,758,056 A * | 5/1998 | Barr ................ G11C 29/76 714/6.32 |
| 5,974,564 A | 10/1999 | Jeddeloh |
| 6,035,432 A | 3/2000 | Jeddeloh |
| 6,115,278 A * | 9/2000 | Deneroff .......... G11C 5/04 361/728 |

(Continued)

FOREIGN PATENT DOCUMENTS

EP 0973095 A1 * 1/2000 .......... G06F 11/1068

OTHER PUBLICATIONS

Paul, et al., "Reliability-Driven ECC Allocation for Multiple Bit Error Resilience in Processor Cache", IEEE Transactions on Computers, vol. 60, No. 1, Jan. 1, 2011, pp. 20-34.

(Continued)

*Primary Examiner* — April Y Blair
*Assistant Examiner* — Dipakkumar Gandhi
(74) *Attorney, Agent, or Firm* — Talem IP Law, LLP

(57) ABSTRACT

Variable width error correction is described. A memory controller can determine, from a memory address, what type of error correction is to be applied for the address region of that memory address and can generate commands for the memory device. An amount of error correction metadata associated with that address region may vary depending on the spatial location of the address region. In some cases, two translations may be performed: one by a processor using information set up by an operating system and another by the memory controller (or the memory device). In other cases, a single translation may be performed, for example by a processor using information set up by the operating system, which can determine the variable error correction during translation of a virtual address region to a real physical address region.

10 Claims, 8 Drawing Sheets

(56) References Cited

U.S. PATENT DOCUMENTS

| | | | |
|---|---|---|---|
| 6,728,146 B1 | 4/2004 | Li et al. | |
| 6,813,678 B1 | 11/2004 | Sinclair et al. | |
| 6,822,913 B2 | 11/2004 | Pochmuller | |
| 6,914,814 B2 | 7/2005 | Im et al. | |
| 7,099,221 B2 | 8/2006 | Klein | |
| 7,117,421 B1* | 10/2006 | Danilak | G06F 11/1008 365/201 |
| 7,219,271 B2 | 5/2007 | Kleveland et al. | |
| 8,972,824 B1* | 3/2015 | Northcott | G11C 16/349 714/718 |
| 2003/0046630 A1 | 3/2003 | Hilbert | |
| 2007/0109881 A1 | 5/2007 | Kuhne | |
| 2007/0226592 A1 | 9/2007 | Radke | |
| 2008/0072120 A1* | 3/2008 | Radke | G06F 11/1068 714/768 |
| 2009/0006706 A1* | 1/2009 | Bartley | G06F 13/4243 710/312 |
| 2011/0016278 A1* | 1/2011 | Ware | G06F 13/1684 711/148 |
| 2011/0225389 A1* | 9/2011 | Grisenthwaite | G06F 12/1009 711/206 |
| 2011/0271164 A1* | 11/2011 | Ahn | G06F 11/1048 714/752 |
| 2013/0083611 A1* | 4/2013 | Ware | G11C 11/4072 365/191 |
| 2014/0173368 A1* | 6/2014 | Collins | G06F 11/076 714/704 |
| 2015/0006993 A1* | 1/2015 | Vogt | G06F 11/1068 714/763 |

OTHER PUBLICATIONS

Schroeder, et al., "DRAM Errors in the Wild: A Large-Scale Field Study", Sigmetrics/Performance 2009, Jun. 19, 2009, 12 pages.

Slayman, Charlie, "Impact and Mitigation of DRAM and SRAM Soft Errors", IEEE Reliability Society, Santa Clara Valley Chapter, May 26, 2010, 43 pages.

Carter, J. et al., "Impulse: Building a Smarter Memory Controller," IEEE Fifth International Symposium on High-Performance Computer Architecture, 1999, pp. 70-79.

"International Search Report and Written Opinion Issued in PCT Application No. PCT/US2015/028104", dated Sep. 17, 2015; 30 Pages.

"Office Action Issued in European Patent Application No. 15726753.5", dated Aug. 11, 2017, 11 Pages.

* cited by examiner

VARIABLE WIDTH ERROR CORRECTION

BACKGROUND

Reliable data storage depends, in part, on the ability of the underlying memory technology—the hardware—to maintain an accurate indication of the data being stored. Defects in the hardware are commonplace due to a variety of factors including the variations in manufacturing, memory usage, and external conditions. In general, memory errors fall within one of two categories of errors. The first type of error is a hard error, which occurs due to a physical defect in the memory hardware. The second type of error is a soft error, which refers to non-permanent errors such as those caused by electromagnetic radiation. Hard errors are also referred to as repeatable errors because they tend to be errors in the data due to a permanent condition, such as a stuck bit; whereas soft errors manifest as a spontaneous flip of a bit to an opposite state. Sometimes, when multiple soft errors occur within a same block (or other designated region) of memory, the error is considered to be a hard error. Both hard and soft errors may occur during the lifetime of memory hardware, and the memory hardware may further degrade over time.

To minimize the adverse effects of memory errors, various error correction techniques may be applied. There are error correction codes, memory parity checking algorithms and hardware solutions using additional memory bits, memory controller error correction and memory logic error correction.

BRIEF SUMMARY

Variable width error correction is described in which a varied number of error correction resources can be applied to different regions of memory. A memory device may be assessed to determine spatial clusters of physical memory grouped by similar expected (and/or experienced) weakness to succumbing to memory errors. Regions with a higher likelihood (or existence) of memory errors or expected usage with sensitive data can be assigned more rigorous error correction, including additional error correction resources such as extra error correction bits. Other regions of data may have varied levels of error correction (and corresponding extra error correction bits) applied.

The amount of error correction resources associated with a memory address to a spatial region in the memory device may be transparent to applications requesting access to the memory device. A size of a real physical memory region associated with a memory address can be equal to or greater than the expected size of the physical memory region associated with that memory address.

In some implementations, a memory device can include logic that performs a translation of an expected physical address to the real physical address that can service a request. In some implementations, a memory device can include logic that enables the adjustment of how the memory device sends the data (for example, a number of cycles used to read data onto and/or off of a data buffer for servicing a request).

In some implementations, a memory controller for one or more memory devices can include logic, firmware, or software that performs a translation of an expected physical address to the real physical address for the memory device that can service a request. The translation can also include a determination of the size of the memory region associated with the real physical address or how the memory sends the data (for example, a number of cycles that should be used to read data onto and/or off of a data buffer of the memory device that can service the request).

In some implementations, an operating system being executed by a processing system of a computing system can perform a translation of a memory address, which may be a virtual address, to a physical address of a memory device coupled to the computing system. The translation performed by the operating system can include determining a corresponding size of the memory region associated with the physical address.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Variable width error correction is described in which a varied number of error correction resources can be applied to different regions of memory.

Certain implementations exploit and address the discovery that a spatial cluster of memory regions may show similar weaknesses with respect to memory errors. As memory devices continue to be developed and increasing density is sought, there may be higher fabrication variation across a substrate from which a memory device is formed. This fabrication variation can result in memory cells that are not uniformly strong. That is, certain cells may be stronger than other cells when holding charge and some cells may be so weak that they cannot hold charge for a specified time (such as the time between the memory refresh that maintains the data for certain volatile memories). The weak cells are likely to cause reliability problems such as seemingly random bit flips (or "soft errors").

It is contemplated that weak cells may be clustered spatially in memory chips. That is, there may be spatial locality in failures. As a result, applying error correction resources (e.g., metadata bits) uniformly over the entire memory, which is a common solution carried out today, could be wasteful, as some regions would receive more error correction resources than needed and some would receive fewer than needed.

A memory device may be assessed to determine spatial clusters of physical memory grouped by similar expected (and/or experienced) weakness to succumbing to memory errors. The assessment may be carried out according to specified conditions—as part of a manufacturing testing (post-fabrication testing), as part of a vendor testing, as part of testing during initialization of the memory device (e.g., as part of a boot process), during run-time, at designated testing times during the life of the memory device (time-sensitive), or a combination of any of these times. Regions with a higher likelihood (or existence) of memory errors or expected usage with sensitive data can be assigned more rigorous error correction, including additional error correction resources such as extra error correction bits. Other regions of data may have varied levels of error correction (and corresponding extra error correction bits) applied.

Figure 1:
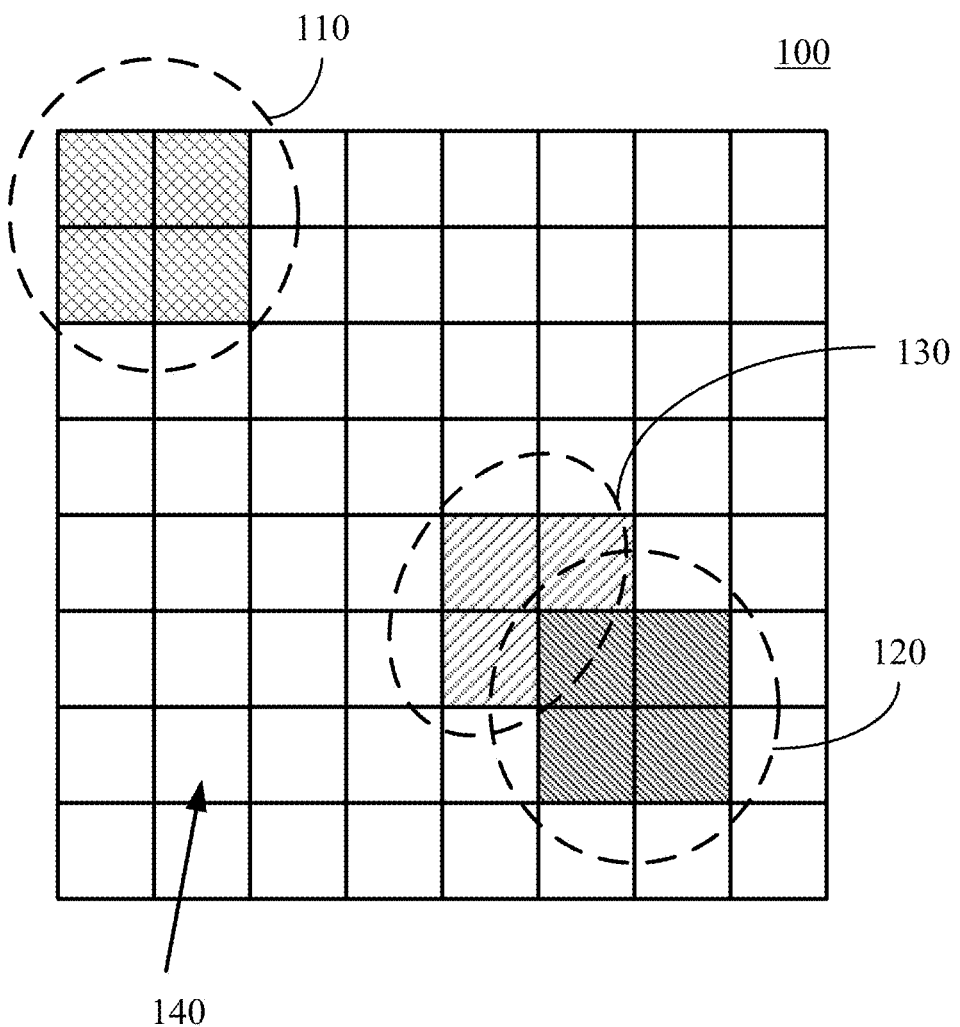
FIG. 1 illustrates an example representative spatial map of a memory array on a memory chip.

FIG. 1 illustrates an example representative spatial map of a memory array on a memory chip. Referring to FIG. 1, a memory chip 100 may include spatial clusters of memory cells (or blocks) having similar expected (and/or experienced) weakness to succumbing to memory errors. For example, a first region 110 may be determined to have a first level of weakness, a second region 120 may be determined to have a second level of weakness that is different or the same as the first level of weakness, and a third region 130 may be determined to have a third level of weakness which may be different than the second level of weakness. Remaining cells 140 may be determined to have a standard level of weakness for which a standard error correction scheme is applied.

Based on these determined levels of weaknesses, a variable width error correction may be applied. Thus, depending on the weakness of a region, the "width" or size of an address region (the memory region associated with a real physical address) may vary.

As an illustrative example, an address to a region containing cells 140 may be associated with a "standard" real physical region size, for example 64 bits. An address to the first region 110 and the third region 130 may be associated with a first level error correction size, for example 72 bits; and an address to the second region 120 may be associated with a second level error correction size, for example 80 bits.

The varied "widths" of an address region (including data and metadata) enable varied levels of error correction. The varied levels of error correction can be tied to spatially distinct regions of memory. As part of the varied levels of error correction, a variable number of correction bits can be associated to regions of memory containing bits used to store actual data. That is, depending on the spatial location of the real physical memory, the data can have different amounts of metadata bits used for error correction.

The variable widths for these error corrections can be maintained as a list, table or other suitable structure in which this information is stored. The list, table or other structure may be used to store the addresses of the memory regions falling within the first region 110, the second region 120 and the third region 130. The list, table or other structure may further include a value indicative of the number of cycles associated with acting on the address region associated with those memory addresses. The number of cycles associated with acting on the address region refers to the read/write processor bus cycle (and timing), often controlled by a finite state machine at a memory device. Instead of or in addition to the value indicative of the number of cycles associated with acting on the address region, the list, table or structure may store a value indicative of the size of the address region or the number of error correction bits associated with a memory address.

The location of the list, table or other structure depends on the implementation and where the mapping (translation) is taking place (e.g., at the memory chip/memory module, the memory controller, or as part of an operating system of a host or other system in communication with the memory module). Accordingly, organized information of error correction attributes such as number of cycles, error correction technique, address region size, number of error correction bits, total number of bits, and the like may be generated and then used for variable width error correction.

The amount of error correction resources associated with a memory address to a spatial region in the memory device may be transparent to (e.g., hidden from) applications requesting access to the memory device. A size of a real physical memory region associated with a memory address can be equal to or greater than the expected size of the physical memory region associated with that memory address. In certain embodiments, error correction entries can be transparently stored within a physical memory region by mapping expected physical regions of the address region to real physical regions that are the same size or larger.

Figure 2A:
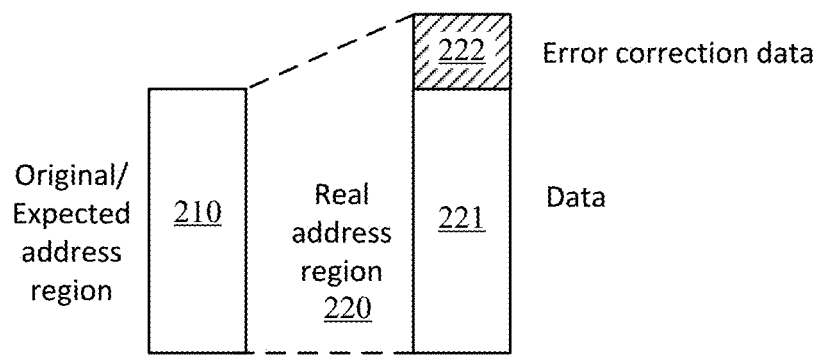
FIGS. 2A and 2B illustrate a mapping of address regions and example arrangement of bits at that address region.
Figure 2B:
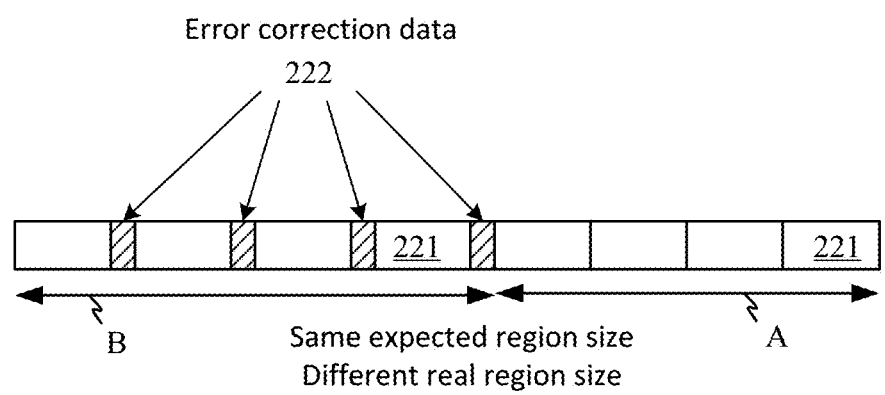

FIGS. 2A and 2B illustrate a mapping of address regions and example arrangement of bits at that address region. Referring to FIG. 2A, the size of an address region associated with an address in memory may be hidden or "transparent" from certain layers of a computing environment. A mapping can be carried out from an original "expected" address region 210 to a real address region 220 that includes data 221 and metadata 222. The metadata 222 can provide the error correction data. The mapping may be carried out at a memory device, at a memory controller, or by an operating system depending on the implementation.

The variable number of correction bits and the bits used to store actual data may be stored near each other, such as contiguously (i.e., data interleaved with metadata) in a memory device, or the correction bits may be stored separate from the data bits, for example on a different chip or at specified memory locations. Where the data and metadata bits are located contiguously, access efficiency may increase.

FIG. 2B shows metadata 222 interleaved with, and located contiguously with, actual data 221. As illustrated in FIG. 2B, a same expected address region of a fixed size may take up real region sizes of the same size or larger. For example, a same expected address region size may be mapped to different real region sizes. In section A, the mapping may be one-to-one where the expected region size is the same as the real region size. In section B, because of the extra bits for error correction, an address region is mapped to a larger real address region.

Figure 3A:
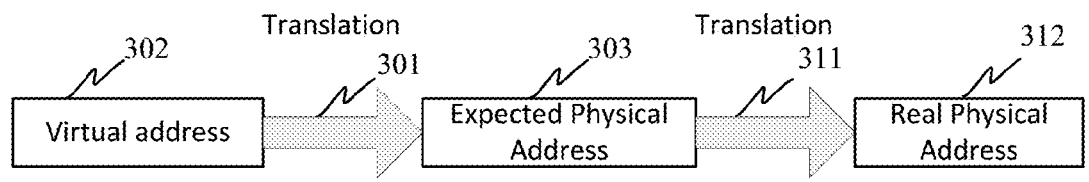
FIGS. 3A and 3B illustrate example implementations of the mapping process that is initiated with a request to a virtual address.
Figure 3B:
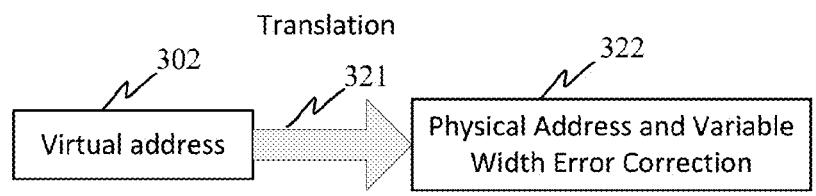

FIGS. 3A and 3B illustrate example implementations of the mapping process that is initiated with a request to a virtual address. Referring to FIG. 3A, in one example implementation, two translations may be carried out: a first translation 301 from a virtual address 302 to an expected physical address 303; and a second translation 311 from the expected physical address 303 to the real physical address 312 with variable width error correction. The first translation 301 can be carried out by a processor and the second translation 311 can be carried out by a memory controller before sending commands to a memory device to which the memory controller communicates. In some cases, other components may perform one or both of the two translations.

For example, a memory controller can receive an expected physical address and determine the real physical address along with the amount of error correction metadata for the real physical address. The memory controller can be responsible for issuing requests with the correct burst size (or the address region size) and performing error detection and correction with variable size metadata. In such a case, the memory chip is not required to perform a translation of a request to support the variable error correction. The memory controller can calculate which request to send and how to send it.

In another example implementation as shown in FIG. 3B, a single translation 321 is performed to map the virtual address 302 to a physical address with variable width error correction 322. The virtual address 302 may be mapped to the physical address with variable width error correction 322 by an operating system loading a particular mapping to a page table and a processor performing the single translation 321 using the information regarding the particle mapping in the page table. In another case, the single translation 321 may be carried out by the operating system (executing on a processor). The physical address with variable width error correction may include an indication of the overhead for the physical address. Overhead refers to the error correction requirements that may be in the form of additional information included in the translation from virtual address to physical address. This additional information may provide reference to number of cycles, number of extra bits, size of the memory region associated with the physical address, type of error correction to be applied and the like.

It should be understood that each translation illustrated in FIGS. 3A and 3B may involve more than one process to achieve the translation from one form to the other form.

Embodiments are applicable to various memory devices including both volatile and non-volatile memory. Although volatile memories, such as dynamic random access memory (DRAM) are specifically described herein, the subject controllers and operating systems are suitable for use with non-volatile memories such as flash memory, phase change memory, or other types of resistive and magnetic memory; and in some cases, systems having hybrid or both volatile and non-volatile memories may implement the described techniques.

DRAM chips are often provided in plurality as part of a dual in-line memory module (DIMM). There a many types of DIMMS, including small outline DIMM (SO-DIMM), double data rate (DDR, DDR2, DDR3) DIMMs, error correction DIMMs (having extra databits either as an additional chip on the DIMM or as part of custom chips), load reduced DIMM (LRDIMM), and through-silicon-via (TSV)-bonded DRAM (e.g., TSV DIMM).

Figure 4:
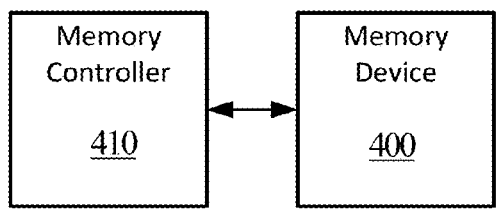
FIG. 4 is a block diagram of a memory system.

FIG. 4 is a block diagram of a memory system. Referring to FIG. 4, a memory system can include a memory device 400 and a memory controller 410 that can control overall input/output operations of the memory device 400.

The memory device may be formed of any suitable memory technology. Although specific implementations are described herein for DRAM technology (and memory modules formed of DRAM chips), other memory devices—volatile and non-volatile—may benefit from variable error correction, including SRAM, phase change memory, flash, and magnetic and ferromagnetic/ferroelectric memories (MRAM, FeRAM, STT-RAM). In some cases, the memory controller 410 and memory device 400 may be integrated on a same chip or arranged on a same module (e.g., on a same board). In some cases, the memory device 400 is provided on a board or package that is separate from the memory controller 410 (e.g., as part of a multi-board system).

For many memory modules, a current trend is to have eight memory device chips for data and one memory device chip for error correction or have extra bits available for error correction at each of the eight chips. Implementations of the subject variable width error correction are applicable to either type of memory module (as well as any other configuration).

Figure 5:
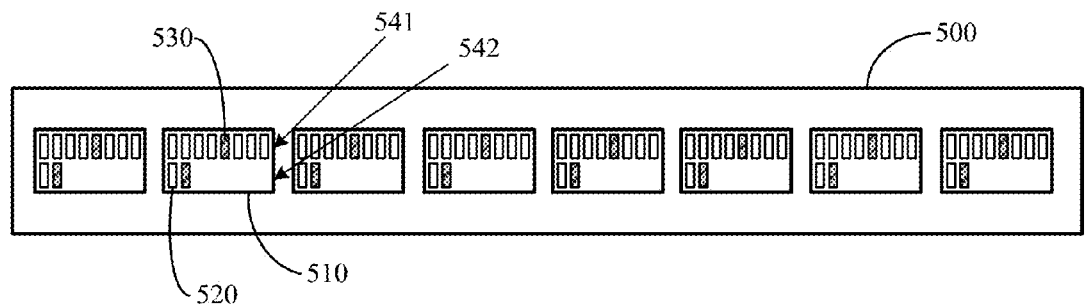
FIG. 5 illustrates interleaving of data and error correction metadata for a memory module.

FIG. 5 illustrates interleaving of data and error correction metadata for a memory module. As shown in FIG. 5, a memory module 500 can include multiple chips 510 in which contiguous data 520 and metadata 530 are interleaved within each chip 510. The memory module 500 may be a DIMM or other memory module. The ratio of data 520 to metadata 530 is d/m. On a memory request for an address and data of size d, instead of performing d/b transfers where b is the memory chip width, the chips perform (d+m)/b transfers ((d+m)/b burst size) each. A burst size refers to the number of cycles required to send a certain amount of data across a bus of limited width. The burst size can be specified by the memory request (either before or at the data module). In the example illustrated in FIG. 5, metadata 530 can be interleaved with the data 520 so the metadata 530 is transferred in the same transfer as the corresponding data it protects.

In addition, because accesses may be unaligned, sometimes two bursts may be used to obtain a single unit of the combined data and metadata. For example, where the memory controller performs the mapping, the memory controller may have to issue two requests to transfer the entirety of the data and metadata because such a scenario requires opening a new row. In a first request from the memory controller, the data 520 and metadata 530 from a first row 541 can be read. Then, in a second request from the memory controller, the data 520 and metadata 530 from a second row 542 can be read.

It should be understood that the arrangement of data 520 and metadata 530 illustrated in the drawing is not intended to be construed as limiting. Data and metadata may be laid out in memory in any suitable arrangement.

For implementations in which the operating system is involved in the translation of the expected address to the real physical address (see e.g., FIG. 3B), the operating system may associate a region of memory corresponding to a multiple of supported page sizes to a certain ratio of data 520 to metadata 530. For example, if d/m=8/1 and page size is 4 KB, the region could be 36 KB. Of course, for implementations where the variable width error correction is transparent to the operating system, such constraints are not required to be applied.

The size of a region can be determined by testing individual portions of memory for their reliability (e.g., by repeatedly writing a certain pattern to memory, reading it back and counting raw number of bit flips). In some cases, the testing can be performed at boot time by, for example the operating system or the memory controller. Of course, testing may be carried out at other times. Once the regions having similar reliability results are defined by the testing, these regions can be assigned a particular error correction level (and thus d/m). An error correction level provides an indication of the strength of error correction to be applied.

The specific error correction technique applied for each level of error correction may be any suitable technique now known or later developed. The error correction level can be based on the sensitivity of the data to be stored in the corresponding region and/or by the amount of failures detected by testing a region as some examples. The error correction level may directly indicate the number of metadata bits used to perform the error correction and/or the error correction level may indirectly indicate the number of metadata bits and be determined according to the selected error correction technique(s) for the particular error correction level. In some cases, the operating system can determine the sensitivity of the data to be stored in the corresponding region. If the type of data changes at run-time, the operating system may adjust the sensitivity indication and even re-adjust the error correction level to be applied to a particular region.

Figure 6:
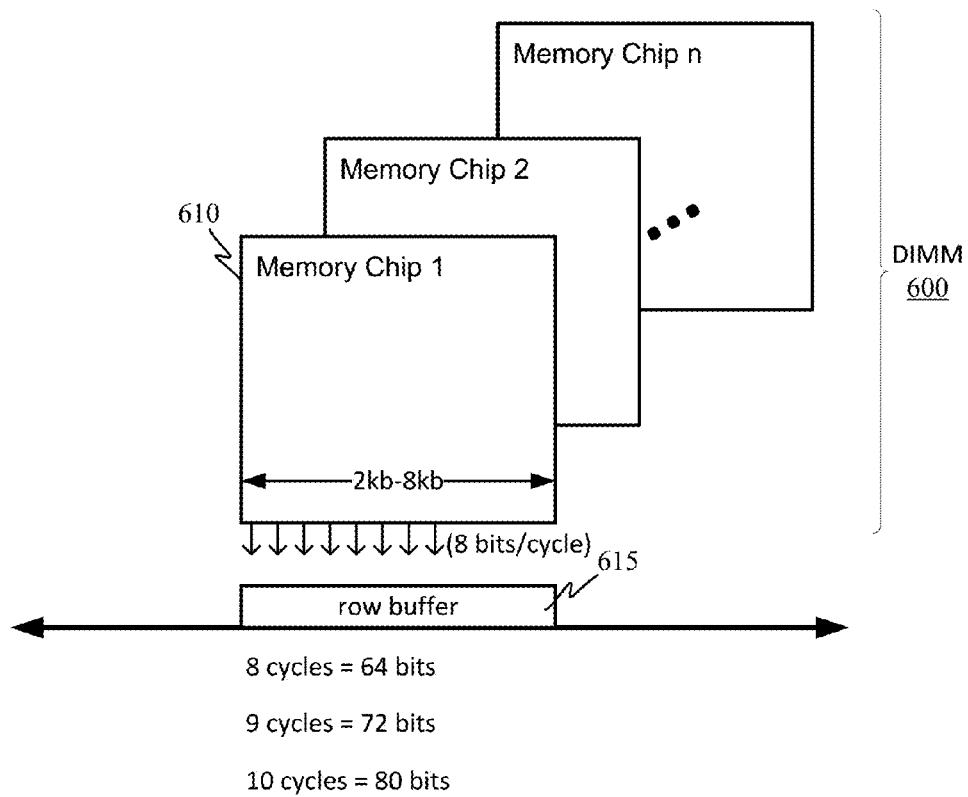
FIG. 6 illustrates a memory module that may have variable width error correction applied.

FIG. 6 illustrates a memory module that may have variable width error correction applied. Referring to FIG. 6, a memory module, such as a DIMM 600, may have multiple memory chips (e.g., memory-chip-1 610, memory-chip-2, . . . , memory-chip-n), and each chip can have multiple arrays of data. The width of these arrays is usually 2 kbits-8 kbits; however, other sizes may be available. Data stored in a memory chip such as memory-chip-1 610 can be read from a memory array into a row buffer 615. From the row buffer 615, at least a portion of the data can be sent to service the request. The particular row of the array can be selected by row select command (which is also referred to as an activate command) and one or more columns of data from the row can be selected by a column select command, which provides the data to the row buffer 615. During a read operation in many current technologies, a row is generally selected and then columns are selected to read out at 8 bits/cycle. Implementations of the subject techniques may be carried out using such memory, but embodiments are not limited thereto.

Variable width error correction may entail associating different amounts of bits with different address requests depending on the spatial location of that address. In order to bring out the appropriate number of bits when a read request is made to a particular address, the number of cycles used to service a request may be varied.

A standard burst size is 4 cycles or 8 cycles for each read. When reading 64 bits from a chip during a memory read operation, 72 bits may be needed to provide the 64 bits of data and 8 bits of error correction. Accordingly, given 8 chips (e.g., such as often found on a DIMM) with a burst size of, for example 8, data may be read from memory in 64 byte blocks. The reading of 64 bytes may be accomplished by reading, over eight cycles (and burst size of eight), eight bytes from eight chips via the row buffer 615.

To obtain the extra bits for error correction, an additional read from a row of the 8 chips may be carried out. Since 72 bytes are desired (to provide eight bytes of error correction for the 64 bytes), the 72 bytes can be obtained by reading two lines of data from each chip (e.g., a first line of 64 bits and a second line of 64 bits from each chip). The additional read may be of the same row or of a different row. Once the 72 bytes are taken to service the request, the remaining 56 bytes from the 128 bytes read from the two lines are generally ignored, resulting in wasted bytes. This scenario may occur when the memory is not specifically adapted for providing error correction bits or is not provided any information to adjust its normal operations. For this type of scenario, the memory controller or logic associated with the read-out bus may enable the 72 bytes out of 128 bytes to be read.

In many cases, the number of bits/cycle is fixed due to the number of pins on the chip; however, the cycles may be adjusted. Instead of having a fixed burst size of 4 cycles or 8 cycles (for each read), each of which brings out 8 bits/cycle (over 4 or 8 cycles), some implementations enable the application of 9 cycles or 10 cycles (or more) depending on the strength of the error correction for a particular memory region. A variable number of cycles can be requested depending on the spatial location of the memory corresponding to the address.

Thus, returning to the example scenario where 72 bits (from a single chip) are used to service a 64 bit data request (due to the extra bits for error correction), 9 cycles may be used to read out 72 bits from a row during a single read operation. Where 80 bits are used to service a 64 bit data request (e.g., 16 extra error correction bits), 10 cycles may be used to read out 80 bits from a row during a single read operation. It should be noted that because of the array configuration of the memory chips, there may be cases where a next row must be activated—during a same request—to retrieve the appropriate number of bits.

It is contemplated that there are numerous methods for retrieving data from a buffer and that suitable methods now known or developed in the future may be used. The particular configuration of the buffer may be any configuration suitable for enabling the retrieval of variable length data. In some cases, it is contemplated that a standard length is retrieved from the buffer and then the appropriate amount of data used (e.g., as in the examples using two reads to retrieve 72 bits or bytes of data).

Figure 7A:
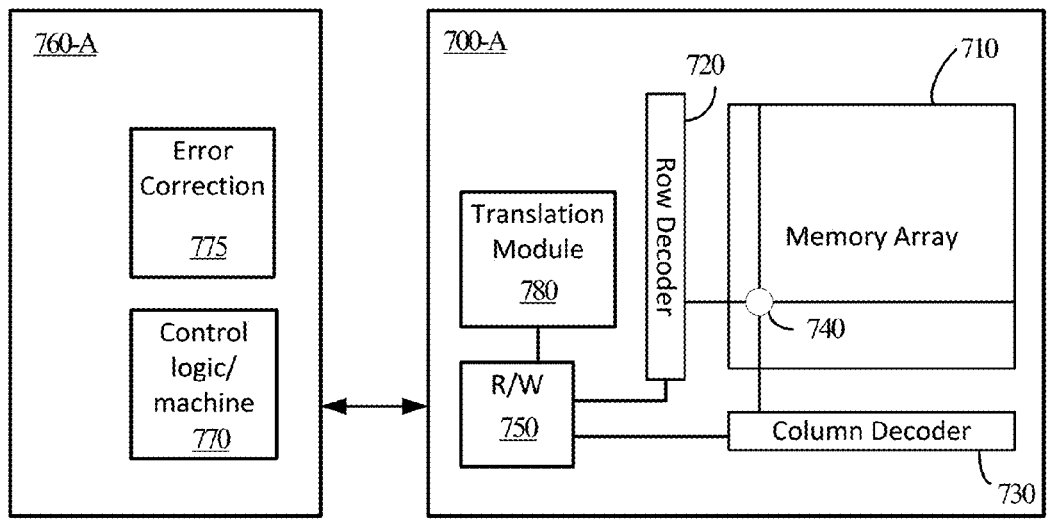
FIGS. 7A and 7B illustrate example memory systems that may implement variable width error correction.
Figure 7B:
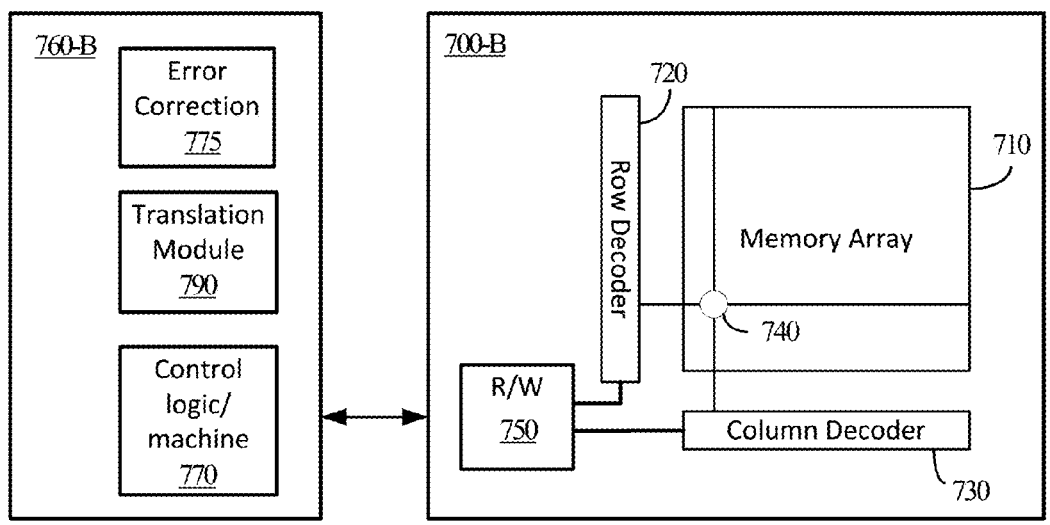

FIGS. 7A and 7B illustrate example memory systems that may implement variable width error correction; and FIGS. 8A-8D show functional diagrams illustrating transformations that may be carried out by the example memory systems of FIGS. 7A and 7B.

Referring to FIGS. 7A and 7B, memory devices 700-A and 700-B may include a memory cell array 710 arranged in rows and columns. A row decoder 720 and a column decoder 730 can be used to select particular cell(s) 740 based on a row select/activation signal and a column select signal. A read/write unit 750 can provide the logic and state machines used to read from and write to the memory array 710. Some error correction techniques may be available as part of the read/write unit 750 as well as any control layers for other capabilities built into the memory device that are hidden from the memory controller 760-A, 760-B.

The memory controllers 760-A and 760-B include the control logic and machines 770 used to respectively control the memory devices 700-A and 700-B, providing the requests for reading and writing data stored at the memory devices 700-A and 700-B. The control logic and machines 770 may include logic elements and registers (storage). Arbitration can be carried out by an arbiter of the control logic and machines 770, which chooses the order in which requests access memory. Static memory controllers generally have a predesigned schedule; whereas dynamic memory controllers may schedule requests in run time. An error correction module 775 may optionally be included for implementations where the memory controller (760-A, 760-B) performs error detection and correction with the variable size metadata.

Variable width error correction, and the corresponding address translations (see e.g., FIGS. 3A and 3B), can be enabled as part of the memory device 700-A (using memory device-based translation or variable error correction accommodation), as part of the memory controller 700-B (using controller-based translation and error correction), as a combination of the two, or as part of an operating system (described later).

Referring to FIG. 7A, a memory device-based translation module 780 can be included as part of, or in communication with, the read/write unit 750. A state machine at the read/write unit 750 can control the number of cycles for a read request according to a value determined by the translation module 780. The translation of an address to the real physical address may be carried out at the memory controller 760-A or as part of the translation module 780. Where the translation of the address to the real physical address occurs at the memory controller, the translation module may provide variable error correction accommodation by adjusting an amount of and how the data (and metadata) are moved across the row buffer (not shown), for example by adjusting a number of cycles.

In some implementations, the memory device (via translation module 780) can include logic that enables the adjustment of how the memory device sends the data (for example, a number of cycles used to read data onto and/or off of a data buffer for servicing a request).

Figure 8A:
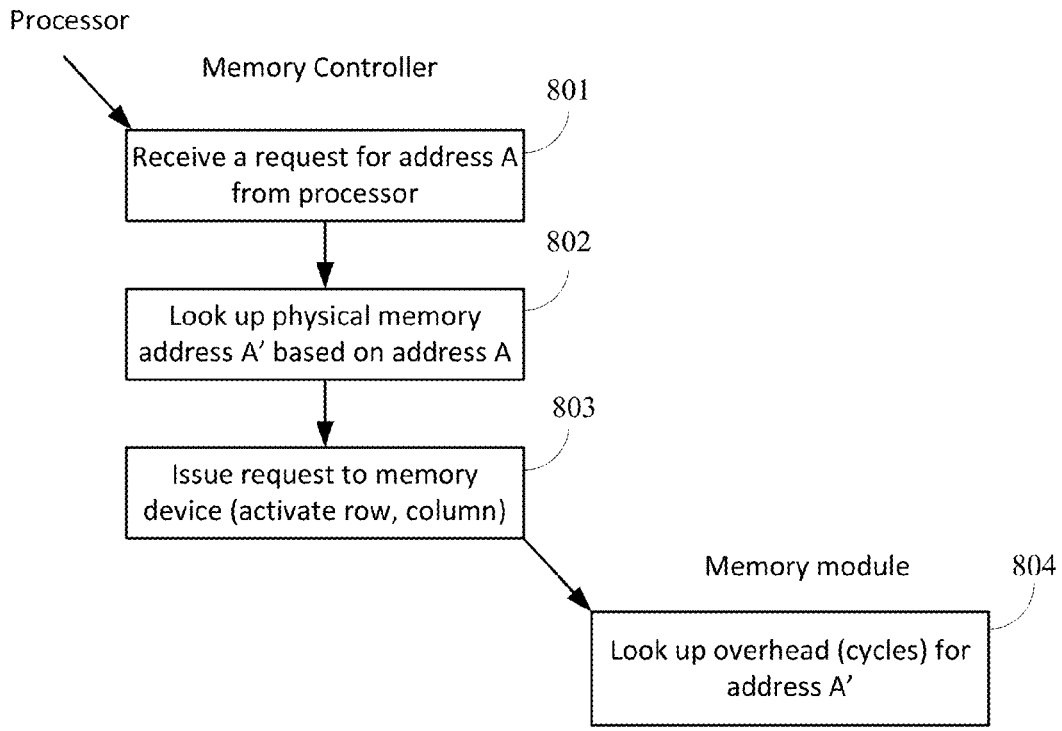
FIGS. 8A-8D show functional diagrams illustrating transformations that may be carried out by the example memory systems of FIGS. 7A and 7B.

For example, referring to FIG. 8A, a memory controller 760-A may receive a request for an expected address A from a processor (801). The memory controller 760-A may translate the expected address A to a real physical address A' by looking up the physical memory address (802), for example in a list, table or other structure ("organized information") stored in a storage system (not shown) of the memory controller 760-A. The memory controller 760-A may then issue a request to the memory device 700-A. The request can include a row command and a column command based on the real physical address A'. Upon receipt of the request from the memory controller 760-A, the memory device 700-A can determine the number of cycles that are to be used to read out the data at the requested address (804).

In this case, the memory device 700-A can interpret the commands using the translation module 780 so that when the read/write unit 750 sends the control signals to read from or write data to the memory array, the appropriate number of cycles are applied (and the appropriate row(s) and column(s) are selected). The translation module 780 can include the logic used to determine the number of cycles associated with a command based on the address indicated by the memory controller to service the request. The read/write unit 750 can use the number of cycles and the real physical address determined by the translation module 780 to service the request.

In some implementations, the memory device (via translation module 780) can include logic that performs a translation of an expected physical address to the real physical address that can service a request.

Figure 8B:
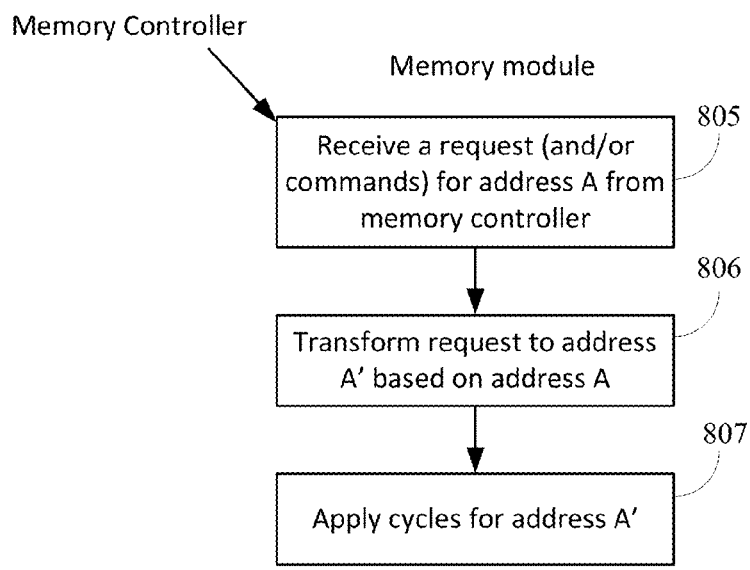

For example, referring to FIG. 8B, the translation from address A to address A' may be performed at the memory device. In this example, the memory device receives a request (and/or commands) for address A from the memory controller (805). The memory device can then transform the request issued from the memory controller to obtain address A' based on the address A as well as determine the number of cycles that are to be used to read out the data (806). The memory device can then apply the appropriate number of cycles for address A' (807). Logic (not shown) may be included at the memory device to enable the translations (and/or transformations) at the memory device. In addition, logic (not shown) may be provided to carry out error correction at the memory device. When the memory device performs the translation of expected address to real physical address, the memory device may alternatively, or in addition, provide information to the memory controller regarding how much data to expect.

Referring to FIG. 7B, the memory controller 760-B can include controller-based translation module 790. When the translation (address mapping/error correction determination) is carried out at the memory controller 760-B, the memory device may be configured with logic to support variable error correction or may be configured without an expectation that variable error correction will be carried out.

In some implementations, the memory controller 760-B (e.g., as part of translation module 790) can include logic, firmware, or software that performs a translation of an expected physical address to the real physical address for the memory device 700-B that can service a request. The translation can also include a determination of the size of the memory region associated with the real physical address or how the memory sends the data (for example, a number of cycles that should be used to read data onto and/or off of a data buffer of the memory device that can service the request). Accordingly, the translation module 790 can translate an expected address having a fixed sized address region to a real physical address having an address region that varies according to the spatial location (and corresponding error correction needs) of the real physical address.

Figure 8C:
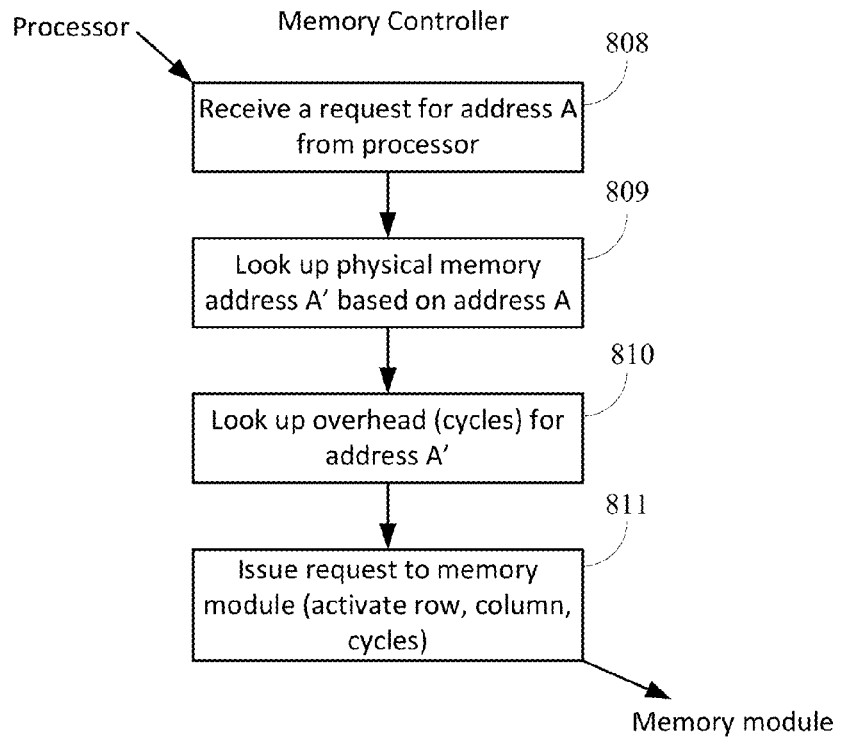

FIG. 8C illustrates a functional diagram for one case where the memory controller handles the error correction determination. Referring to FIG. 8C, the memory controller can receive a request for address A from a processor (808) and translate address A to address A' by, for example looking up the real physical address A' corresponding to address A (809). In this scenario, the memory controller 760-B, via the controller-based translation module 790, can also determine the number of cycles used for address A' (810). Steps 809 and 810 may be part of the same or separate processes related to the translation from address A to address A'. Once the memory controller 760-B obtains the real physical address and the overhead, the memory controller 760-B can issue the request to the memory module 700-B (811). The request can include activate row and column command signals as well as cycle information. In some cases, the cycle information can be an independent command. In other cases, the cycle information can be a cycle command embedded in one or both of the row command and column command. For example, one or more extra bits may be provided with the column command to specify the number of cycles to send data for.

A state machine at the read/write unit 750 of the memory device 700-B can control the number of cycles for a read request according to the cycle information sent from the memory controller 760-B. The cycle information may be a value indicative of the number of cycles to be used to take the bits from the buffer (or "register"). The state machine may perform a number of cycles according to the value. Additional logic can be included to facilitate the cases where the data spans more than one row so that the state machine takes into account the change of row when managing the number of cycles used to read out the data.

Figure 8D:
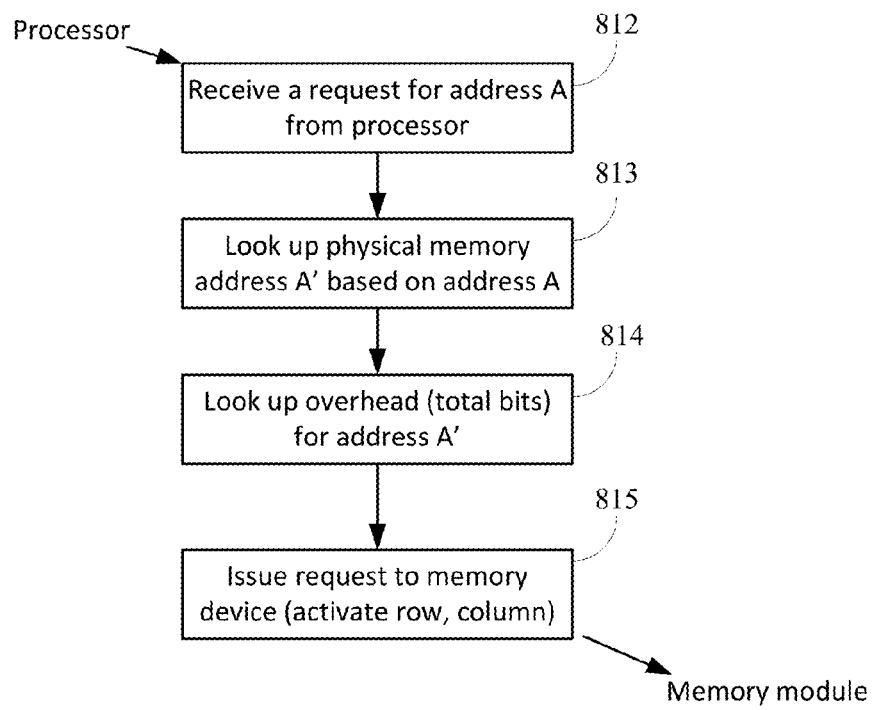

Another example is shown in FIG. 8D, where instead of a number of cycles, the memory controller keeps track of a size of the memory region or a total number of bits that should be used to provide data and error correction. Referring to FIG. 8D, the memory controller 760-B, can receive a request to address A from a processor (812). The memory controller 760-B can perform a translation of the address A to address A', for example by performing a look up of the real physical address A' (813) and by performing a look up to determine the overhead (total bits) that should be read from address A' (814). The memory controller 760-B can then issue a request to the memory device, sending commands to activate appropriate logic at the memory device (815). The memory controller can determine whether multiple commands are to be generated for the memory device to service a request. In some cases, the memory controller may send one or more row commands and one or more column commands depending on the location of the start address and size of the accessed region.

As a result of the read request (815), the memory controller receives bits from the memory device. Where more than one row command and/or more than one column command is issued from the memory controller, the set of commands to obtain the appropriate number of bits from the memory device may be issued according to any suitable timing technique. For example, the memory controller may issue the command for a second column (or second row or combination of second row and second column) before the last bit from the first row and column has been received by the memory controller.

A determination can be made by the memory controller if the bits received from the memory device meet the conditions for the amount of bits expected for the address location. In this example, if the number of received bits match the expected number of bits (total bits) or are more than the expected number of bits, the memory controller can service the request to the processor. If the memory controller received more bits than expected, only a specified number of bits may be sent to the processor when servicing the request to the processor. This may occur when error correction schemes are carried out at the memory controller and are not carried through to the processor level or where the memory device is requiring multiple reads instead of a cycle adjustment to return an appropriate number of bits (and the bits that are not needed are discarded by the memory controller).

In this example scenario, the memory device may or may not be performing any specific processes related to the variable width error correction (e.g., adjusting the cycles). Memory controllers may support either or both types of memory devices and conditions for issuing a row or column command may be based on the particular implementation.

Figure 9A:
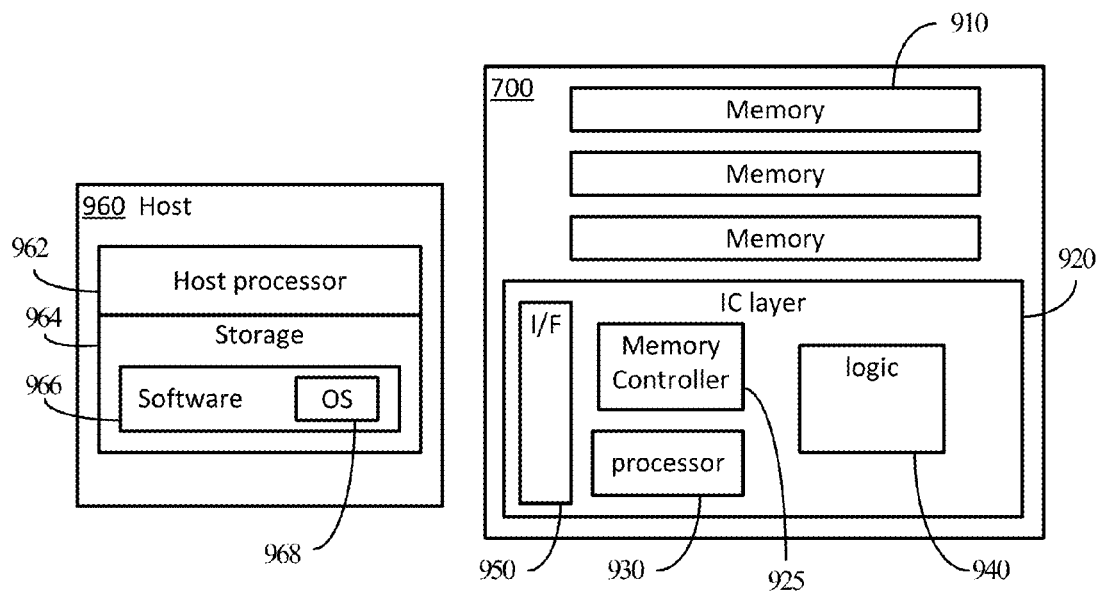
FIGS. 9A and 9B illustrate operating environments in which certain implementations of the variable width error correction may be carried out.
Figure 9B:
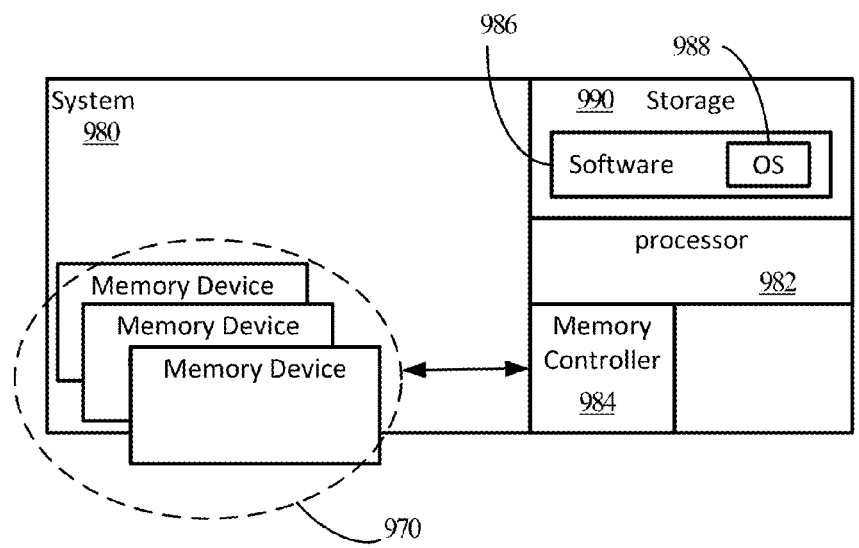

FIGS. 9A and 9B illustrate operating environments in which certain implementations of the variable width error correction may be carried out. FIG. 9A illustrates a system on a chip configuration in which an integrated circuit (IC) 900 is provided in a two-dimensional (2D) or three dimensional (3D) structure with on-chip memory. One example of a 3D IC arrangement is to have multiple stacks of memory 910 on an IC layer 920, such as described by the wide I/O DRAM standard. One example of a 2D IC arrangement is to have the memory 910 embedded on the same die as the IC layer 920, such as eDRAM (embedded DRAM). A memory controller 925 can be included on the IC layer 920. The memory controller 925 may be a separate component or integrated with a processor 930 or microprocessor. As illustrated, a processor 930 and, optionally, other logic 940 may also be available on the IC layer 920.

An interface 950 may be included for transmitting and receiving signals external to the IC 900, for example, to communicate with peripheral components. In one scenario, the interface may be used to communicate with a host 960 having a host processor 962, storage system 964 storing software 966, including operating system 968. In another scenario, an operating system and other software can be stored in one or more of the stacks (or blocks) of memory 910.

FIG. 9B illustrates another non-limiting example configuration in which variable error correction for memory devices 970, for example in the form of memory modules, may be carried out. The system 980 illustrated in FIG. 9B may be part of a distributed system that may include a group of functionally interchangeable servers or resources. The servers or resources can include various storage devices or systems. These resources may be taken on and off-line and additional resources may be added. The resources to which the system 980 forms a part may be located together in a same space, such as at a single data center, or they may be located individually and/or in clusters at different geographical locations. The system 980 can be suitable for use in high performance systems including those handling complex computations and/or those managing large systems such as servers handling cloud services and finance computation systems.

The system 980 may be implemented as server, which can include one or more computing devices. The server can include one or more blade server devices, standalone server devices, personal computers, routers, hubs, switches, bridges, firewall devices, intrusion detection devices, mainframe computers, network-attached storage devices, and other types of computing devices. The server hardware can be configured according to any suitable computer architectures such as a Symmetric Multi-Processing (SMP) architecture or a Non-Uniform Memory Access (NUMA) architecture.

The system 980 can include a processing system 982, which may include a processing device such as a central processing unit (CPU) or microprocessor and other circuitry that retrieves and executes software 986, including an operating system (OS) 988, from storage system 990. Processing system 982 may be implemented within a single processing device but may also be distributed across multiple processing devices or sub-systems that cooperate in executing program instructions.

Examples of processing system 982 include general purpose central processing units, application specific processors, and logic devices, as well as any other type of processing device, combinations, or variations thereof. The one or more processing devices may include multiprocessors or multi-core processors and may operate according to one or more suitable instruction sets including, but not limited to, a Reduced Instruction Set Computing (RISC) instruction set, a Complex Instruction Set Computing (CISC) instruction set, or a combination thereof. In certain embodiments, one or more digital signal processors (DSPs) may be included as part of the computer hardware of the system in place of or in addition to a general purpose CPU.

A memory controller 984, which may be integrated with or separate from processing system 982, can control overall input/output operations of the memory devices 970.

Storage system 990 may comprise any computer readable storage media readable by processing system 982 and capable of storing software 986. Storage system 990 may include volatile and nonvolatile, removable and non-removable media implemented in any method or technology for storage of information, such as computer readable instructions, data structures, program modules, or other data.

Examples of storage media include random access memory, read only memory, magnetic disks, optical disks, CDs, DVDs, flash memory, magnetic cassettes, magnetic tape, magnetic disk storage or other magnetic storage devices, or any other suitable storage media. Certain implementations may involve either or both virtual memory and non-virtual memory. In no case do storage media consist of a propagated signal. In addition to storage media, in some implementations storage system 990 may also include communication media over which software 986 may be communicated internally or externally.

Storage system 990 may be implemented as a single storage device but may also be implemented across multiple storage devices or sub-systems co-located or distributed relative to each other. Storage system 990 may include additional elements, such as a controller, capable of communicating with processing system 982.

Software 986 may be implemented in program instructions and among other functions may, when executed by system 980 in general or processing system 982 in particular, direct system 980 or processing system 982 to support variable error correction. For example, OS 988 can include pre-processing instructions that facilitate the generation of organized information used by the operating system to translate a virtual address to a physical memory address with variable error correction such as described herein.

Software 986 may also include additional processes, programs, or components, such as operating system software or other application software. Software 986 may also include firmware or some other form of machine-readable processing instructions executable by processing system 982.

System 980 may represent any computing system on which software 986 may be staged and from where software 986 may be distributed, transported, downloaded, or otherwise provided to yet another computing system for deployment and execution, or yet additional distribution.

It should be understood that the examples and embodiments described herein are for illustrative purposes only and that various modifications or changes in light thereof will be suggested to persons skilled in the art and are to be included within the spirit and purview of this application.

What is claimed is:

1. A memory controller, comprising:
   a translation module that translates expected physical memory addresses having fixed sized address regions to real physical memory addresses having varying sized address regions, wherein the varying sized address regions are tied to spatially distinct regions of memory having similar expected or experienced weakness to succumbing to memory errors;
   wherein the translation module:
      receives an expected physical memory address;
      performs a look up of a real physical address for the expected physical memory address; and
      performs a look up of an error correction attribute of the corresponding real physical memory address, wherein the error correction attribute comprises an indication of a number of cycles to service a read request to the corresponding real physical memory address, wherein the number of cycles assigned to each spatially distinct region of memory are dependent on a determined error correction requirement; and
   control logic that issues commands to at least one memory device according to the real physical address identified by the translation module, wherein the commands comprise a row command and a column command based on the real physical memory address, and a cycle command based on the number of cycles indicated by the error correction attribute.

2. The memory controller of claim 1, further comprising a storage system providing registers for the memory controller and storing organized information corresponding to error correction attributes for the real physical memory addresses, wherein the translation module performs the look up of the error correction attribute in the storage system.

3. The memory controller of claim 2, wherein the organized information is generated by testing the at least one memory device for spatially clustered weaknesses, the memory controller being configured to generate the organized information upon specified conditions.

4. The memory controller of claim 3, wherein the specified conditions comprise at least one of a boot condition, a run-time based condition, and a time sensitive condition.

5. The memory controller of claim 1, wherein the cycle command is embedded in one or both of the row command and the column command.

6. A memory controller, comprising:
   a translation module that translates expected physical memory addresses having fixed sized address regions to real physical memory addresses having varying sized address regions, wherein the varying sized address regions are tied to spatially distinct regions of memory having similar expected or experienced weakness to succumbing to memory errors;
   wherein the translation module:
      receives an expected physical memory address; and
      performs a look up of a real physical address for the expected physical memory address; and
   control logic that issues commands to at least one memory device according to the real physical address identified by the translation module,
   wherein the real physical memory addresses store interleaved data and error correction metadata, and include aligned memory addresses and unaligned memory addresses,
   wherein for a read request to an expected physical memory address translated by the translation module to an unaligned memory address, the control logic issues, as part of a same read request, commands comprising a first row activation command, a first column command, a second row activation command and a second column command.

7. A memory controller comprising hardware and configured to:
   associate error correction requirements with physical regions containing memory cells or blocks of a memory module that have similar expected or experienced weakness to succumbing to memory errors and that are spatially clustered;
   determine, for a real physical memory address, an error correction requirement based on which physical region of the physical regions that memory cells or blocks addressed by the real physical memory address belongs; and
   send a command to the memory module based on the error correction requirement, wherein the error correction requirement comprises a number of cycles to service a read request for the memory module, the command comprising a cycle command based on the number of cycles indicated by the error correction requirement.

8. The memory controller of claim 7, wherein the memory controller is further configured to perform error correction on data received from the memory module as a result of the command according to the error correction requirement.

9. The memory controller of claim 7, wherein the memory controller is further configured to:
   receive a request comprising an expected memory address; and
   perform a translation from the expected memory address to the real physical memory address, wherein the command to the memory module corresponds to the request.

10. The memory controller of claim 7, wherein the memory controller is further configured to test the memory module for spatially clustered weaknesses of physical regions of the memory module and generate error correction attributes for the real physical memory addresses to the physical regions of the memory module.

* * * * *